(12) United States Patent
Misdom

(10) Patent No.: US 12,114,409 B2
(45) Date of Patent: Oct. 8, 2024

(54) ENERGY METERING AND SURGE CURRENT DETECTION

(71) Applicant: SIGNIFY HOLDING B.V., Eindhoven (NL)

(72) Inventor: Johannes Adrianus Cornelis Misdom, Weert (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 184 days.

(21) Appl. No.: 17/916,069

(22) PCT Filed: Mar. 26, 2021

(86) PCT No.: PCT/EP2021/058042
§ 371 (c)(1),
(2) Date: Sep. 30, 2022

(87) PCT Pub. No.: WO2021/204569
PCT Pub. Date: Oct. 14, 2021

(65) Prior Publication Data
US 2023/0156894 A1    May 18, 2023

(30) Foreign Application Priority Data
Apr. 9, 2020  (EP) .................................... 20169051

(51) Int. Cl.
*H05B 47/25*    (2020.01)
*G01R 19/165*   (2006.01)
*G01R 22/06*    (2006.01)
*H02H 1/00*     (2006.01)

(52) U.S. Cl.
CPC ....... *H05B 47/25* (2020.01); *G01R 19/16571* (2013.01); *G01R 22/065* (2013.01); *H02H 1/0007* (2013.01)

(58) Field of Classification Search
CPC .................. H05B 47/25; G01R 19/165; G01R 19/16571; G01R 22/065; G01R 22/06; G01R 15/183; H02H 1/00; H02H 1/0007
USPC .................................................... 361/86–87
See application file for complete search history.

(56) References Cited

U.S. PATENT DOCUMENTS

| | | |
|---|---|---|
| 3,333,155 A | 7/1967 | Steen |
| 4,176,386 A | 11/1979 | Chow |
| 4,543,524 A | 9/1985 | Bulley |
| 4,796,148 A | 1/1989 | Ruta |
| 8,611,062 B2 | 12/2013 | Bishop et al. |
| 2005/0007034 A1* | 1/2005 | Kobayashi .............. H02M 7/06 315/308 |

(Continued)

FOREIGN PATENT DOCUMENTS

| | | |
|---|---|---|
| CN | 106771533 A | 5/2017 |
| DE | 1241526 B | 6/1967 |

(Continued)

*Primary Examiner* — Danny Nguyen

(57) ABSTRACT

A circuit is provided for energy metering and surge current detection. It uses a current transformer. A first current sensing arrangement is connected to the secondary side of the transformer for energy metering and a second current sensing arrangement is connected to the secondary side, with a high pass filter, for surge current detection. A single component is thus able to provide energy metering and surge detection.

14 Claims, 3 Drawing Sheets

(56) References Cited

U.S. PATENT DOCUMENTS

2006/0232906 A1* 10/2006 Sueoka .................. H02H 3/048
                                                                     361/118
2008/0085131 A1    4/2008  Kitazawa et al.
2012/0249336 A1  10/2012  Moell et al.
2014/0104731 A1    4/2014  Kolker et al.
2016/0018457 A1    1/2016  Park et al.

FOREIGN PATENT DOCUMENTS

| | | |
|---|---|---|
| EP | 3373018 A1 | 9/2018 |
| JP | 62173914 A | 7/1987 |
| JP | H0417286 A | 1/1992 |
| JP | H07244111 A | 9/1995 |
| WO | 2017114646 A1 | 7/2017 |

* cited by examiner

ENERGY METERING AND SURGE CURRENT DETECTION

CROSS-REFERENCE TO PRIOR APPLICATIONS

This application is the U.S. National Phase application under 35 U.S.C. § 371 of International Application No. PCT/EP2021/058042, filed on Mar. 26, 2021, which claims the benefit of European Patent Application No. 20169051.8, filed on Apr. 9, 2020. These applications are hereby incorporated by reference herein.

FIELD OF THE INVENTION

The invention relates to a circuit for energy metering and surge current detection.

BACKGROUND OF THE INVENTION

Energy metering is of increasing interest to consumers as they try to reduce their energy consumption. It is of interest generally for calculating and monitoring energy costs.

For example, it is known for some LED lighting applications to monitor the power consumption of the LEDs for various reasons. For example, verification of power consumption of a lighting system may be required for remuneration of energy costs.

For this purpose, an LED lighting arrangement may for example include an analogue-to-digital converter (ADC) as part of an energy-metering circuit, placed between the input terminals (that connect to a rectified mains input) and a driver stage. Measured values of voltage and current, representing the voltage and current of the LED light source, are provided to the ADC, which samples the inputs and computes the consumed power. A microcontroller of the LED lighting arrangement can then use this information to control operation of the driver.

Surge robustness of LED drivers is another topic of increasing interest. The higher the surge voltage the driver can withstand, the more robust the driver will be. It is also of interest to monitor surge events. For example, if the end of life of the driver due to current surges can be predicted, preventive maintenance can be carried out. Especially for road lighting applications, predictable maintenance is of importance.

One of the key parameters for end of life prediction is an accurate measurement of the surge current. However, surge current measuring is a high cost function. The monitoring microprocessor needs to be isolated from the point where the surge current is sensed, so an isolator is required. The use of an opto isolator would require an additional supply which is not desired.

A passive solution based upon a current transformer has therefore been proposed as it has lower cost than an optical isolation system, and more reliable for coping with high surge currents (and corresponding voltages).

However, when separate systems for surge current monitoring and energy metering are involved, there is a significant increase in system cost to provide these monitoring solutions.

SUMMARY OF THE INVENTION

The invention is defined by the claims.

According to examples in accordance with an aspect of the invention, there is provided a circuit for energy metering and surge current detection, comprising:
- a current transformer having a primary winding and a secondary winding;
- a first current sensing arrangement connected to the secondary winding, for energy metering; and
- a second current sensing arrangement connected to the secondary winding, for surge current detection, wherein the second current sensing arrangement comprises a high pass filter.

This circuit enables both energy metering of a load and surge current detection with a single transformer. This provides a low cost and compact way to implement both functions. The high pass filter means that the correct functioning of the energy metering is not influenced by the second current sensing arrangement, because a current at the normal operating frequency is filtered out by the second current sensing arrangement. For example, the current transformer may operate at the mains frequency (50 Hz or 60 Hz) and the high pass filter blocks the mains frequency (i.e. the cutoff frequency is above 50 Hz or 60 Hz).

The first current sensing arrangement may comprise a first resistor across which an energy metering signal is measured. The current flowing to the first resistor (when there is no surge event) is a known proportion of a load current, which load current (or a portion thereof) flows through the primary winding. Thus, energy consumption by the load can be derived. The energy metering signal for example comprises a voltage across the first resistor.

The second current sensing arrangement for example comprises a second resistor across which a current surge signal is measured. Thus, for surge events which have high frequency (i.e. short duration) current spikes are not filtered by the high pass filter, and a signal can be measured. The current surge signal for example comprises a second voltage across the second resistor.

The first resistor for example has a larger resistance than the second resistor. In particular, the first resistor is for sensing a small current resulting from normal operation of the load, hence a large resistor is used to generate a significant sense voltage. The second resistor is for sensing a large (but short duration) current pulse, hence a smaller sense resistor may be used.

The high pass filter for example comprises a series capacitor between the secondary winding and the second resistor. In combination with the second resistor, a high pass filter is formed.

The first current sensing arrangement may further comprise a low pass filter at an input of the first current sensing arrangement.

This is used to filter out high amplitude current surge signals, which would otherwise saturate the energy meter reading signal, for example being outside the range of an analog to digital converter of the energy metering system.

The second current sensing arrangement may further comprise a sample and hold circuit at an output of the second current sensing arrangement. This is used to store the signal from a short duration current surge, to make the reading of the signal easier. The sample and hold circuit for example comprises a peak detector circuit.

The secondary winding may comprise first and second winding portions in series, wherein a virtual earth is defined at the junction between the first and second winding portions, and the ends of the first and second winding portions opposite the junction each connect to a transformer output through a respective forward diode, and wherein the first and second current sensing arrangement are each connected to the transformer output and to the virtual earth.

This arrangement means the current surge can be detected with either polarity.

The invention also provides a LED lighting circuit comprising:
- a LED unit; and
- a circuit for energy metering and surge current detection as defined above for metering energy usage by of the LED unit and surge current sensing and counting.

The circuit preferably further comprises a LED driver, wherein the circuit for energy metering and surge current detection is connected with the primary winding of the current transformer in series along an input line to the LED driver.

These and other aspects of the invention will be apparent from and elucidated with reference to the embodiment(s) described hereinafter.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE EMBODIMENTS

Figure 1:
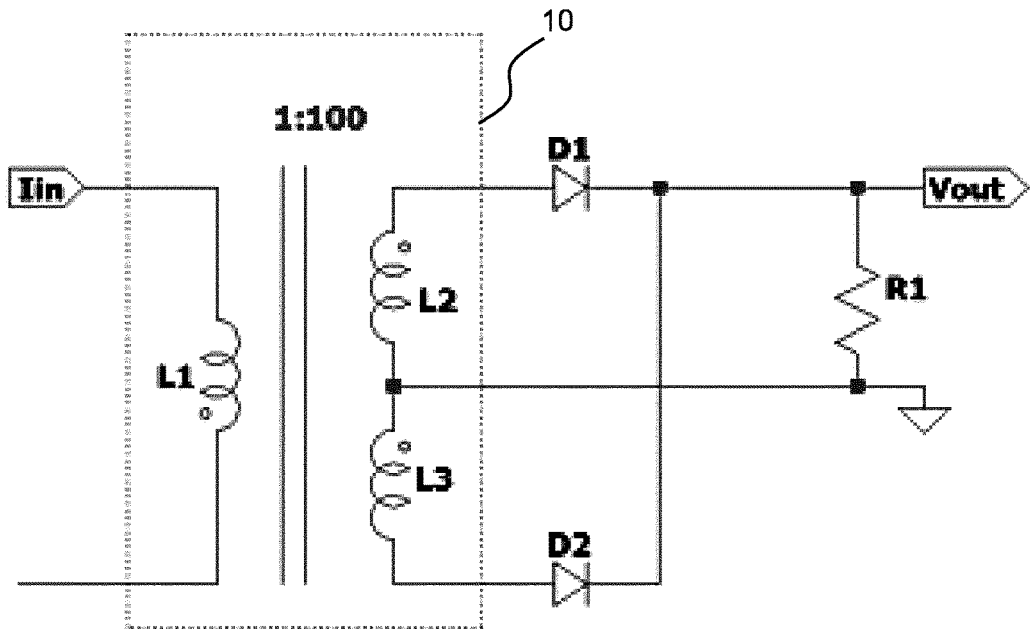
FIG. 1 shows a known energy metering system.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

The invention provides a circuit for energy metering and surge current detection. It uses a current transformer. A first current sensing arrangement is connected to the secondary side of the transformer for energy metering and a second current sensing arrangement is connected to the secondary side, with a high pass filter, for surge current detection. A single component is thus able to provide energy metering and surge detection.

FIG. 1 shows a known energy metering system. A current transformer 10 has a primary winding (winding i.e. coil L1) and a secondary winding (series first and second winding portions, i.e. coils, L2 and L3). A current being monitored is supplied to the primary winding. The transformer has a large turns ratio, e.g. 1:100, so that a small current is delivered by the secondary winding.

A virtual earth is defined at the junction between the first and second secondary coils L2, L3, and the ends of the coils L2, L3 opposite the junction each connect to a transformer output Vout through a respective forward diode D1 and D2, thus forming a rectifier.

A current sensing resistor R1 is connected between the transformer output Vout and the virtual earth. This arrangement means the output voltage Vout is independent of the polarity of the input current.

The termination of the secondary side with a resistor R1 thus converts the primary current in the transformer into a voltage on the secondary side. This arrangement works well within a certain current range.

The invention aims to provide a circuit which is suitable for use both as a surge current sensor (e.g. counter) with currents typically in the range of 1 kA to 10 kA and for an energy metering system for monitoring currents typically in the range 1 to 10 A. To achieve this, an analog to digital converter for processing Vout may be used with a very high accuracy and range (e.g. more than 20 bits). The invention aims to provide a lower cost solution.

Figure 2:
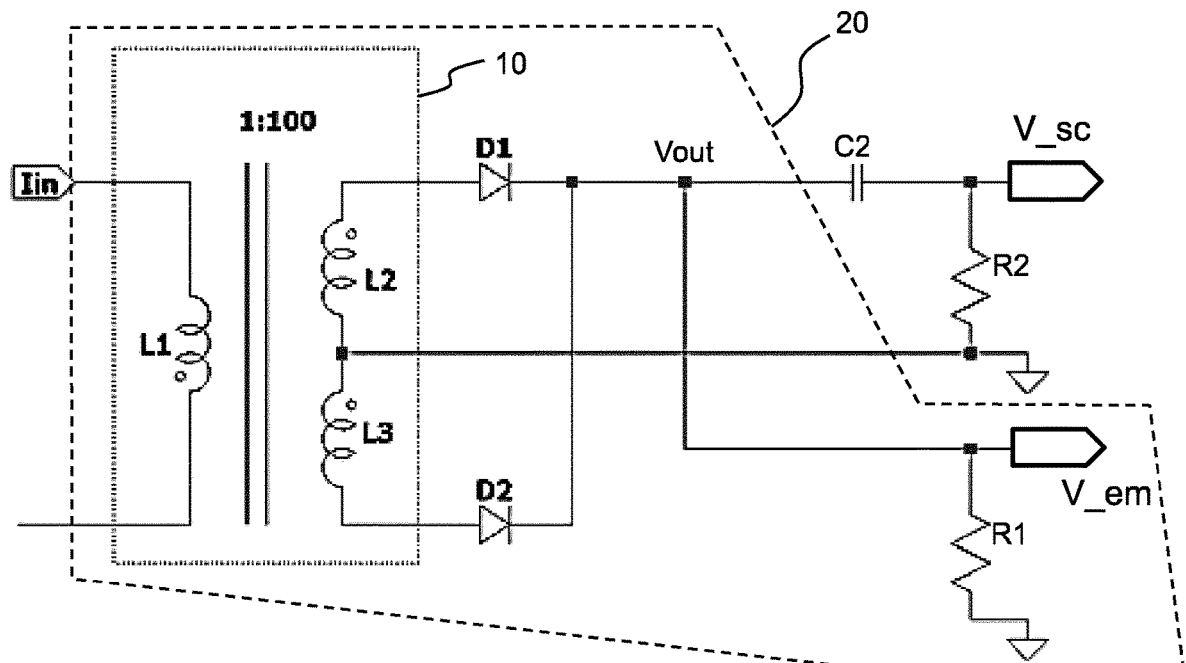
FIG. 2 shows an example of a circuit in accordance with an example of the invention.

FIG. 2 shows an example of a circuit in accordance with an example of the invention.

The circuit components shown in block 20 correspond to FIG. 1.

The circuit generates two outputs from the output node Vout. A first output is the energy metering signal V_em, measured across the resistor R1 in the same way as in FIG. 1. The resistor R1 thus functions as a first current sensing arrangement connected to the secondary winding L2, L3, for energy metering.

A second output is a surge current detection signal V_sc, measured across a second resistor R2. There is also a series capacitor C2. The resistor R2 and capacitor C2 function as a second current sensing arrangement connected to the secondary winding L2, L3, for surge current detection. The resistor R2 and capacitor C2 function as a high pass filter.

In normal operation, the primary winding L1 of the current transformer is supplied with a current of the order of 1 A at mains frequency, e.g. 50 Hz. In the secondary winding L2, L3, a current of 10 mA will be present for a 1:100 turns ratio.

The capacitor C2 has a high impedance for the 50 Hz signals, so the full secondary current will flow to the other (first) sensing resistor R1. By way of example, R1=3.3 kΩ. This will result in a voltage of 3.3V, suitable for application to the input of a standard analog to digital converter.

Of course, the turns ratio and the resistance of R1 may take any suitable values to obtain a desired voltage level for monitoring at the output for energy metering purposes.

When a surge current for example for 1 kA is present at the input winding L1, surge frequencies are in the range of >100 kHz. The capacitor C2 will act as a short so the secondary current of approximately 10 A will be fed into the second current sense resistor R2. The combination of the capacitor C2 and resistor R2 function as a high pass filter.

The high pass filter means that the correct functioning of the energy metering is not influenced by the surge current sensing arrangement, because a current at the normal operating frequency is filtered out. The high pass filter blocks the mains frequency (i.e. the cutoff frequency is above 50 Hz or 60 Hz, for example in the range 100 Hz to 500 Hz).

The second resistor R2 has a lower resistance than the first so that the voltage resulting from a large surge current (1 kA) can be measured. For example if R2=1Ω this would result in a 10V pulse.

This circuit enables both energy metering of a load and surge current detection with a single transformer. This provides a low cost and compact way to implement both functions.

During a current surge event, the voltage rises for example to 10V as explained above. Because the transformer output Vout is coupled to both sensing outputs V_sc and V_em, the energy monitoring output also rises to 10V. This is outside the range for the input voltage of the analog to digital converter, which will saturate.

Figure 3:
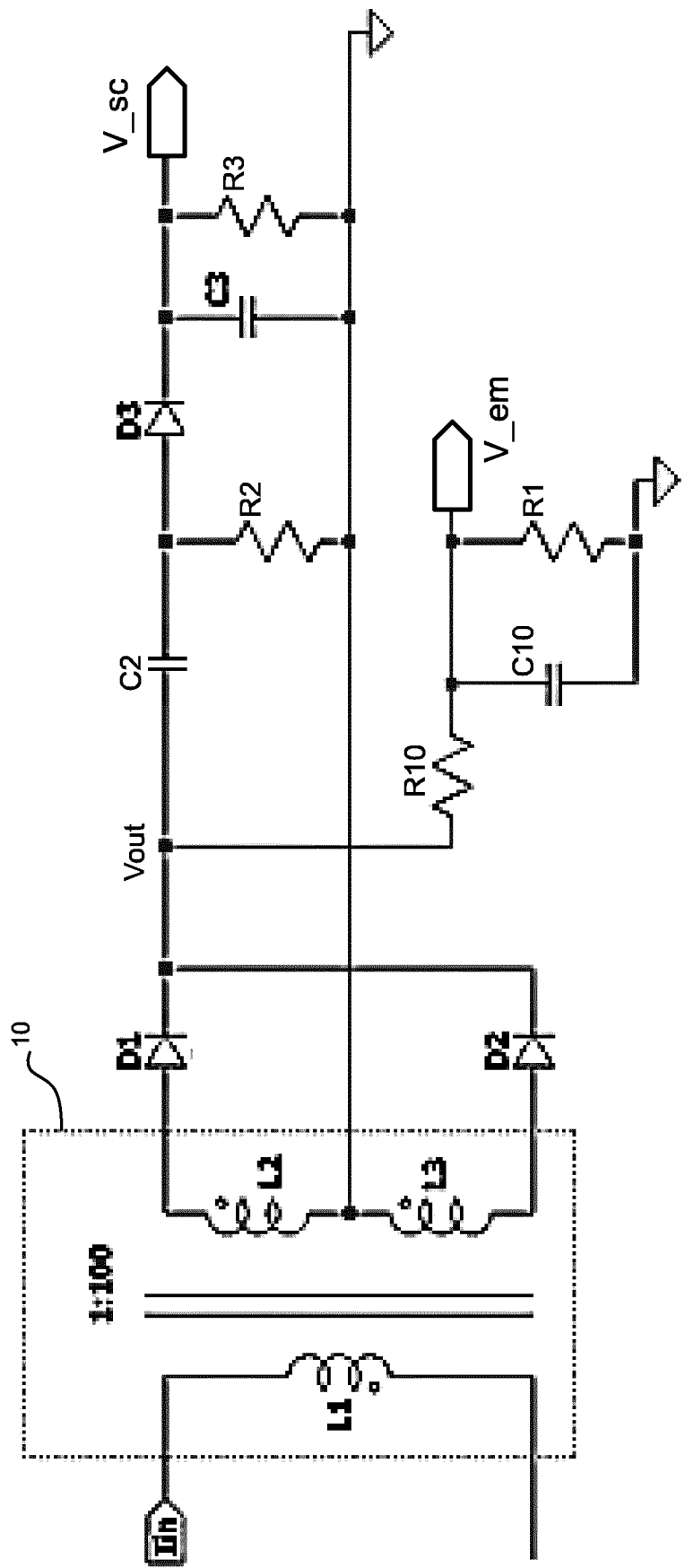
FIG. 3 shows a modification to the circuit of FIG. 2.

To avoid inaccuracies in the energy monitoring function that could result, a circuit modification may be used as shown in FIG. 3.

The first current sensing arrangement additionally comprises a low pass filter R10, C10 between the secondary winding (i.e. Vout) and the first current sense component. i.e. the resistor R1. Thus, the low pass filter is at the input of the first current sensing arrangement. This is used to filter out high amplitude current surge signals, which would otherwise saturate the energy meter reading signal, for example being outside the range of the analog to digital converter of the energy metering system. An additional advantage is that with this low pass filter, higher harmonics of the mains frequency are attenuated.

An IEC requirement for energy metering is that the measurement should be up to the 5$^{th}$ harmonic.

The low pass filter has a cutoff frequency to allow the mains signal to pass but cut off higher frequencies above the desired maximum harmonic. The cutoff frequency is for example in the range 250 Hz to 1 kHz.

This low pass filter thus blocks the surge current thereby protecting the circuitry that is measuring the current for energy metering.

As the surge current is a short spike, either a fast analog to digital converter is needed for processing V_sc or else a sample and hold function may be used. FIG. 3 shows a sample and hold function implemented by a peak detector circuit D3, C3, R3 for processing the voltage across the resistor R2 before delivery to measuring circuitry.

The current spike causes the capacitor C3 to charge through the forward diode D3 to a level depending on the peak of the current spike. The discharging of the capacitor (after sufficient time for measurement of the signal) depends on the discharge resistor R3 in parallel with the capacitor C3. This circuit temporarily stores the signal from a short duration current surge, to make the reading of the signal easier.

Figure 4:
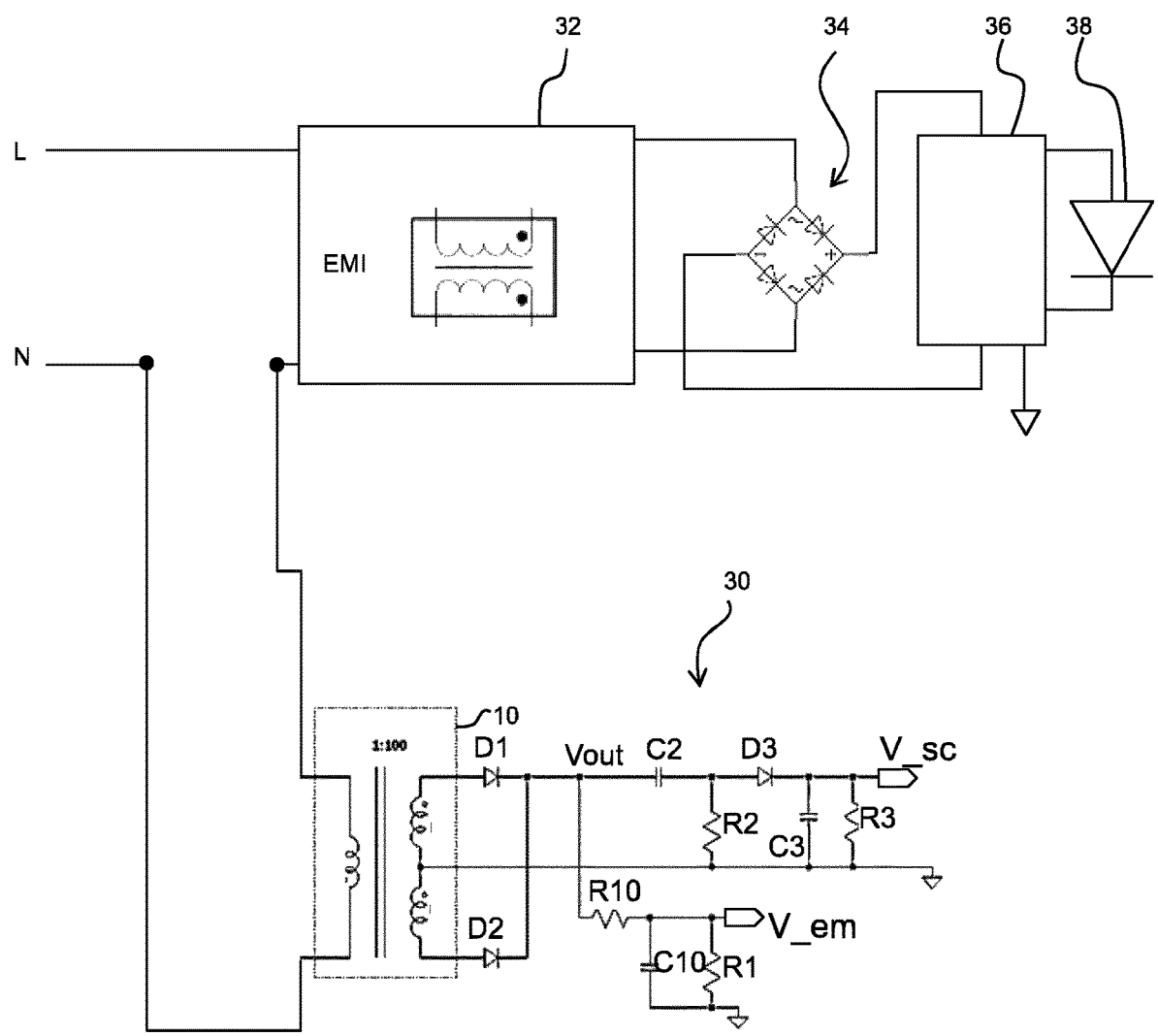
FIG. 4 shows a LED lighting circuit comprising a LED unit and the circuit for energy metering and surge current detection.

FIG. 4 shows a LED lighting circuit comprising a LED unit and the circuit for energy metering and surge current detection as described above.

The input to the circuit is the line and neutral lines L, N. The primary winding L1 of the current transformer 10 is in series with either one of the input lines. FIG. 4 shows the circuit 30 for energy metering and surge current detection connected with the primary winding L1 in series with the neutral line, so that the current to neutral flows through the primary winding L1.

The EMI stage 32 is downstream of the input lines, followed by the rectifier 34. The rectifier delivers power to a LED driver 36 such as a switch mode power converter (of any suitable type). This driver delivers power to the LED unit 38.

The circuit 30 for example connects, via its ground connections, to the chassis ground of the LED driver 36. This chassis ground for example connects to the negative output of the rectifier (not shown in FIG. 4). The mains isolation may instead be in the driver 36 in which case the circuit 30 may be grounded to a location within the LED driver 36.

The LED and driver are not described in detail since any know arrangement may be used.

The invention is of particular interest for LED drivers, but it may also be used in a wide range of applications where a surge counter and energy metering function are used.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality.

The mere fact that certain measures are recited in mutually different dependent claims does not indicate that a combination of these measures cannot be used to advantage.

If the term "adapted to" is used in the claims or description, it is noted the term "adapted to" is intended to be equivalent to the term "configured to".

Any reference signs in the claims should not be construed as limiting the scope.

The invention claimed is:

1. A circuit for energy metering and surge current detection, comprising:
   a current transformer having a primary winding and a secondary winding (L2, L3);
   a first current sensing arrangement connected to the secondary winding, for energy metering; and
   a second current sensing arrangement connected to the secondary winding, for surge current detection, wherein the second current sensing arrangement comprises a high pass filter, wherein the secondary winding comprises first and second winding portions in series, wherein a virtual earth is defined at the junction between the first and second winding portions, and the ends of the first and second winding portions opposite the junction each connect to a transformer output through a respective forward diode, and wherein the first and second current sensing arrangement are each connected to the transformer output and to the virtual earth.

2. The circuit according to claim 1, wherein the high pass filter has a cutoff frequency above a frequency of normal operation of the current transformer.

3. The circuit according to claim 2, wherein the frequency of normal operation of the current transformer is a mains frequency.

4. The circuit according to claim 1, wherein the first current sensing arrangement comprises a first resistor across which an energy metering signal is measured.

5. The circuit according to claim 4, wherein the energy metering signal comprises a voltage across the first resistor.

6. The circuit according to claim 4, wherein the second current sensing arrangement comprises a second resistor across which a current surge signal is measured.

7. The circuit according to claim 6, wherein the current surge signal comprises a second voltage across the second resistor.

8. The circuit according to claim 6, wherein the first resistor has a larger resistance than the second resistor.

9. The circuit according to claim 6, wherein the high pass filter comprises a series capacitor between the secondary winding and the second resistor.

10. The circuit according to claim 1, wherein the first current sensing arrangement further comprises a low pass filter at an input of the first current sensing arrangement.

11. The circuit according to claim 1, wherein the second current sensing arrangement further comprises a sample and hold circuit at an output of the second current sensing arrangement.

12. The circuit according to claim 11, wherein the sample and hold circuit comprises a peak detector circuit.

13. A LED lighting circuit comprising:
a LED unit; and
the circuit for energy metering and surge current detection according to claim 1 for metering energy usage by the LED unit and surge current sensing and counting.

14. The LED lighting circuit according to claim 13, further comprising a LED driver, wherein the circuit for energy metering and surge current detection is connected with the primary winding of the current transformer in series along an input line to the LED driver.

\* \* \* \* \*